United States Patent [19]

Berger et al.

[11] Patent Number: 4,945,420
[45] Date of Patent: Jul. 31, 1990

[54] LOW NOISE READING METHOD AND CIRCUIT FOR LINE TRANSFER PHOTOSENSITIVE MATRICES

[75] Inventors: Jean-Luc Berger; Marc Arques, both of Grenoble, France

[73] Assignee: Thomson-CSF, Paris, France

[21] Appl. No.: 293,469

[22] Filed: Jan. 4, 1989

[30] Foreign Application Priority Data

Jan. 5, 1988 [FR] France .................. 88 00027

[51] Int. Cl.$^5$ .............................................. H04N 3/14
[52] U.S. Cl. ............................ 358/213.31; 358/213.26
[58] Field of Search ............. 358/213.31, 909, 213.26; 357/24 LR

[56] References Cited

U.S. PATENT DOCUMENTS

| 3,963,942 | 6/1976 | Sequin et al. | 307/221 R |
| 4,611,234 | 9/1986 | Berger et al. | 358/213.31 |
| 4,685,117 | 8/1987 | Arques | 358/213.26 |
| 4,695,890 | 9/1987 | Boucharlat et al. | 358/213.31 |
| 4,752,829 | 6/1988 | Kim | 358/213.31 |
| 4,833,539 | 5/1989 | Berger | 358/213.31 |

OTHER PUBLICATIONS

Proceedings of 5th International Conference on Charge-Coupled Devices, Sep. 1979, pp. 33–39.
RCA Review, vol. 40, No. 3, Sep. 1979, pp. 241–277.

Primary Examiner—Stephen Brinich
Attorney, Agent, or Firm—Oblon, Spivak, McClelland, Maier & Neustadt

[57] ABSTRACT

The disclosure concerns photosensitive matrices and, more precisely, the read circuit connected to each of the output columns of the matrix. To reduce the noise of a transfer from a column to an output register, there is performed, N times successively, a transfer of the charge Qs to be read from the column to an intermediate storage zone, a duplication of this charge and a summation of the duplicated charges Qs*, and a restitution of the charge Qs to the column. If the transfer noises are decorrelated with respect to one another, the overall signal-to-noise ratio is improved in a ratio of $N^{\frac{1}{2}}$. A fraction of the sum of the replica charges (for example the mean of the N replica charges) is transmitted to the output and constitutes the output signal of the read circuit.

9 Claims, 4 Drawing Sheets

FIG_4

FIG_5

LOW NOISE READING METHOD AND CIRCUIT FOR LINE TRANSFER PHOTOSENSITIVE MATRICES

BACKGROUND OF THE INVENTION

1. Field of the Invention

The invention concerns line transfer photosensitive matrices, namely matrices of photosensitive elements arranged in networks of lines and columns, wherein each line of photosensitive elements can be addressed so as to discharge the charges, generated by the photosensitive element located at the intersection between this line and this column, on to a column conductor of a defined column of the matrix. The charges thus discharged are applied to a compartment of a charge transfer shift register, the other compartments of which receive the charges discharged by the other columns of the matrix.

The matrix works in two stages which are periodically renewed: a first stage during which the photosensitive elements produce and store charges under the effect of an illumination, while the shift register simultaneously shifts, towards its output, those charges that it has received during the previous period; and a second stage during which the register receives, from the columns, those charges collected by the photosensitive elements during the first stage.

The invention more especially concerns the read circuit of this matrix, namely the circuit through which the charges are transferred from the columns to the register during the second stage of each period.

2. Description of the Prior Art

One of the problems encountered with this type of matrix is that of the noise introduced during the transfer of the charges, through the read circuit, between the columns of the matrix and the shift register. This noise is generally of thermal origin. It consists of a certain quantity of undesirable charges, which are not caused by the illumination of the photosensitive elements but are transferred at the same time as the charges generated by the illumination.

Now, the higher the capacitances applied, the greater is the noise. In particular, given the matrix structure of the device, the overall capacitance of a column of photosensitive elements is the sum of the capacitances of the individual, photosensitive elements connected to this column. For example, the individual capacitance of a photosensitive element may be typically one picofarad and that of a column may be 2000 picofarads for a large-format matrix of 2000 lines based on amorphous silicon.

It may be considered that the $B^{th}$ thermal noise introduced when there is a capacitance with a value C is substantially equal to:

$$B^{th} = (kTC/q^2)^{\frac{1}{2}}.$$

Where K is Boltzmann's constant, T is the temperature in degrees Kelvin and q is the charge of the electron.

In concrete terms, for a capacitance of 1 picofarad, the noise is equal to 400 electrons which disturbs the useful signal transferred to the column. For a column capacitance of 2000 picofarads, the noise is 18,000 electrons. This is a huge value if it is considered that it is sought to detect a signal corresponding to a few thousands of electrons for low illuminations.

To reduce the noise introduced by the column capacitance and transferred from the column to the output shift register, it has already been proposed to insert a feedback amplifier between the column and a transfer gate used for the periodic removal of the charges of the column towards the shift register. The amplifier has a negative gain $-G$. Thus, a positive potential fluctuation at the column, corresponding to an excess of transferred noise charge, means a reduction in the potential applied to the transfer gate: this reduces the injection current and consequently causes the transfer of a smaller charge. The amplifier thus introduces a compensation effect which restricts the injected noise charge. It may be then assumed everything happens as if the transfer beneath the gate has come from a column with a capacitance C/G instead of C. The thermal noise introduced is therefore divided by $G^{\frac{1}{2}}$.

A great deal can be gained, in this way, on the thermal noise and, therefore, on the dynamic range of the useful signal that can be obtained on the side of the low levels of illumination.

Unfortunately, the gain $-G$ amplifier, which has been introduced into the circuit, itself introduces noise into the transferred charges.

SUMMARY OF THE INVENTION

The invention proposes a new approach to reduce the noise introduced by the transfer of charges from the matrix to the output shift register.

According to the invention, it is proposed to transfer N times (N being a whole number greater than or equal to 2) from the column to an intermediate storage zone, the quantity of charges that it is desired to read, to duplicate it each time, to restore the original charge, each time, to the input column, to use the duplicated charge to establish a quantity of charges proportionate to the sum of the charges transferred each time, and finally to transfer, to the output register, a quantity of charges proportionate to the sum of the charges transferred towards the intermediate zone.

By this device, it is seen that the noise transferred is reduced inasmuch as the noises introduced during each transfer are decorrelated from one another and, therefore, cancel each other out partially. It can be shown that the overall noise of this multiple transfer is divided by $N^{\frac{1}{2}}$ as compared with the noise which would be introduced by a single transfer.

To implement this method, the present invention proposes a read circuit connected to a column of the matrix (or more generally of an input conductor of the read circuit), said circuit comprising:

a means to transfer a quantity of charges to be read, from the column to an intermediate storage zone;

a means to generate a quantity of charges which is the replica of the charge transferred into the intermediate storage zones;

a means to retransfer the charge stored in the intermediate zone to the column;

a means to repeat the operations for the transfer from the column to the intermediate zone and for the generation of a quantity of charges forming a replica of the transferred charge;

a means to store a charge which is the sum of the replica charges;

and a means to transfer a charge, proportionate to the sum of the replica charge, towards the output.

It is consequently understood that, instead of transferring the quantity of the charges to be read from the column to the register in one single operation, this quantity of charges is transferred towards an intermediate zone, it is duplicated so as to be stored, and it is retransmitted to the column; the operation is repeated and the second duplicated charge is added to the first duplicated charge. At the end of N transfers, the thermal noise that has collected in the sum of the duplicated charges is not multiplied by N in relation to the noise of a single transfer, but only by $N^{\frac{1}{2}}$. All that remains to be done is to transfer this sum of duplicated charges to the output or, better still, to transfer a charge which is the mean of the duplicated charges towards the output. The signal-to-noise ratio is then improved by a ratio of $N^{\frac{1}{2}}$.

Preferably, the means to transfer the charges from the column to the intermediate storage zone is a charge injector comprising a diode connected to the column, a passage gate between the diode and the intermediate zone, an intermediate storage gate above the intermediate storage zone and a negative gain amplifier having an input connected to the column and an output connected to the passage gate. With this type of injector with amplifier, the transfer period of a charge is greatly accelerated, thus enabling the implementation of the invention without the repetition of N successive transfers leading to an excessive reading period.

As for the means used to generate the quantity of replica charges, it preferably comprises, firstly, a second injector similar to the first one, comprising a diode, a passage gate and an ancillary storage gate above an ancillary storage zone and, secondly, a comparator having a first input connected to the intermediate storage gate, a second input connected to the ancillary storage gate, and an output connected to the passage gate of the second injector with a means to temporarily apply a common reference voltage to the two inputs of the comparator.

Finally, the means used to store the sum of the replica charges preferably includes two storage gates which are, in principle, carried to the same potential but are separated by a blocking gate. When the blocking gate is carried to a higher potential than that of the two gates, both gates form a single gate. When the blocking gate is then carried to a low potential, each of the two gates stores a fraction (in the ratio of the surfaces of the gates) of the accumulated charges. One of these fractions is applied to the output of the reading device and is, for example, discharged into an output charge transfer register This fraction may be $1/N^{th}$ of the sum of the replicated charges.

BRIEF DESCRIPTION OF THE DRAWINGS

Other features and advantages of the invention will emerge from the following detailed description, made with reference to the appended drawings, of which.

DESCRIPTION OF PREFERRED EMBODIMENTS

Figure 1:
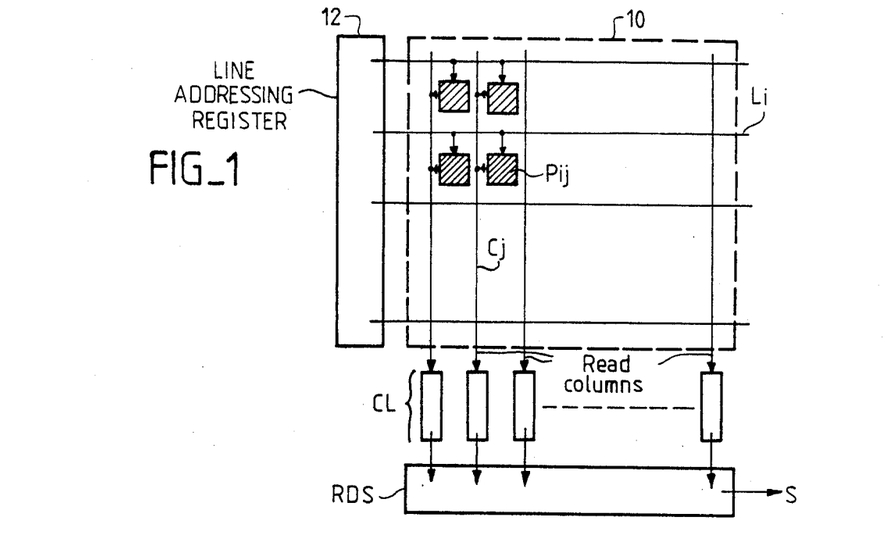
FIG. 1 shows a general simplified view of a line transfer photosensitive matrice.

The general configuration of a line transfer photosensitive matrice is shown in FIG. 1. It has a network 10 of lines Li and columns Cj with, at the intersection of each line and each column, a photosensitive detection element Pij. In response to a read signal applied to a line selected by a line decoder 12, each photosensitive element of this line may provide, at the column conductor to which it is attached, a quantity of charges proportionate to the integral of the light illumination flux to which it is subjected during a determined integration period.

The column conductors are connected to a read circuit CL, capable of receiving the charges of each column and converting them into a signal applied to a respective compartment of an output shift register RDS; there are as many register compartments as there are output columns and these compartments are filled simultaneously by signals representing the illumination of the different photosensitive elements of that line of the network 19 which has just been selected by the decoder 12.

After the filling of the shift register RDS in parallel, the register is made to work as a series output shift register to transfer, towards the output register, the content of successive compartments and to thus provide, at the output S, a signal showing the illuminations of the successive elements of the selected line.

The read circuit considered according to the present invention is the circuit CL interposed between the columns of the network and the register.

In practice, the register RDS is a charge transfer register and, consequently, the signal transferred into the compartments of the register which will be formed by a quantity of electrical charges.

As can be seen in the schematic drawing of FIG. 1, the read circuit CL is formed by as many identical, individual read circuits CLj as there are columns Cj in the network 10.

We shall describe only one of these read circuits CLj, as proposed according to the present invention, to reduce the transfer noise between the column and the register.

Figure 2:
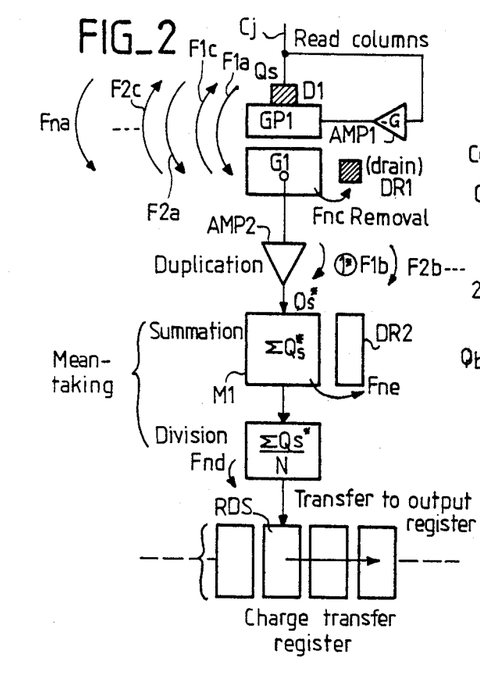
FIG. 2 shows a schematic diagram of a structure of a read circuit according to the invention.

FIG. 2 gives a schematic view of the main elements enabling an implementation of the noise reduction method proposed herein.

The column Cj, to which there comes a quantity of charges Qs representing the useful signal to be read, is connected by a charge injector formed by a diode D1 and a passage gate Gp1 designed to enable the passage of charges from the diode D1 towards a semiconducting region which shall hereinafter be called an intermediate storage zone. This intermediate storage zone is located beneath a gate G1 which may also be called an intermediate storage gate.

The intermediate storage gate is carried to a potential which is sufficiently positive to enable an accumulation of charges in the region that it covers.

The passage gate Gp1 is connected to the output of an amplifier AMP1 with negative gain $-G$, the input of which is connected to the read column Cj and hence to the diode D1.

Through this charge injector, the charge Qs is transferred beneath the intermediate storage gate G1, with a relatively limited thermal noise which, nonetheless, includes the noise generated by the amplifier AMP1 itself.

It will be noted that, in the vicinity of the gate G1, there may be provided a drain region $D^R$ carried to a potential which is sufficiently positive so that, in the event of excessively intense illumination (saturation), the excess charges which cannot be stored beneath the gate G1 are removed and do not disturb the other circuit elements. It will be seen, in the following explanations, that this drain region DR1 also enables the removal of charges stored at the end of the read cycle when there is no longer any need for them.

The operation cycle of the read circuit can be broken down, according to the invention, into N steps each essentially comprising three stages.

The arrow F1a in FIG. 2 represents the path of the charges during the first stage of the first step of the read cycle.

During a second stage, still during the first step, a charge Qs*, which is the replica of the charge Qs, is prepared and stored. This replica charge Qs* will remain even when the charge Qs is no longer present beneath the intermediate storage gate G1.

The arrow F1b of FIG. 2 represents this preparation of this charge Qs*.

The term "replica" charge of the charge Qs implies a charge which may be equal to the charge Qs or have a known ratio with the charge Qs. In the preferred practical embodiment, it is a charge equal to Qs and, in the rest of the description, the words "'duplication' of the charge Qs" shall be used in referring to the preparation of the replica Qs*.

The charge Qs is duplicated by using an amplifier AMP2 according to an operational mode which shall be explained further below.

The replica charge Qs* is stored in a so-called "accumulation region" beneath a conducting gate M1.

In a third stage (restitution stage) of the first step, represented by the arrow F1c in FIG. 2, the charge Qs is restored to the diode D1 and the column Cj: this charge Qs had been transferred in the reverse direction in the first phase. This restitution is done by carrying the gate G1 to a highly negative potential with respect to the potential of the column Cj.

It shall be seen further below that the charge then ending at the column is really the starting charge even if the transfer of the first phase had a certain degree of inefficiency (i.e. even if a percentage of the initial charge may have not been transferred).

The first step of the read cycle ends thus.

The second step is a repetition of the stages of the first step, namely a stage (arrow F2a) for transfer from the column to the intermediate storage gate G1, then a stage of duplication (arrow F2b) of the transfer charge and a stage of restitution of the charge Qs to the column Cj.

However, the "replica" charge formed at the second stage is added, in the accumulation region beneath the gate M1, to that formed during the first step. In other words, the new replica charge Qs* is discharged in the accumulation zone beneath the gate M1 without beforehand removing the previous charge.

If the number of steps N is greater than two, then the process is continued in repeating, each time, the three stages of transfer, duplication and restitution.

At the $N^{th}$ and last step, the only difference is that the restitution phase is eliminated and replaced by a stage for the removal, towards the drain DR1, of the charge Qs which is longer needed. The arrow Fnc of FIG. 2 represents this stage for removal towards the drain DR1.

In the accumulation region beneath the gate N1, there is then stored the sum of the replica charges Qs* resulting from the N transfer and duplication operations which have just been performed.

It is this cumulated charge which represents, overall, N times the initial charge Qs, but having an attached transfer noise which is not N times but $N^{\frac{1}{2}}$ times the noise of a single transfer.

It will be noted that the accumulation region should have a storage capacity which is all the higher as N is greater.

If N is great, the quantity of charges accumulated at the end of the read cycle of one line of the matrix will be far too great to be capable of being transferred into the output register where the compartments are generally of small capacity for reasons of space factor and operating speed.

Consequently, provision is preferably made for performing a division by a predetermined quantity of the charge stored in the accumulation region beneath the gate M1 so as to transfer only a (known) fraction of this charge towards the output register RDS.

In one embodiment, it may be chosen to divide the charge precisely by the number N to result in a charge of the same order as in read circuits that do not use the principle of the second invention.

This then results in the transfer, into the output register, of the mean of the duplicated charges Qs*.

It will be understood, however, that should the "replica" charges Qs* represent the initial charge Qs divided by a known coefficient (which itself may also be N), it will not necessarily be required to carry out, in the end, the division of the accumulated charge beneath the gate M1.

In FIG. 2, the arrows Fnd and Fne respectively show the operations for transfer, to the output register, of the fraction of the charge accumulated during the n previous stages, and for removal, to a drain DR2, of the rest of the charge accumulated beneath the gate M1, since it is necessary to start again from zero before recommencing a read cycle.

We have thus described the essential features of the operating principle of the present invention. The various stages of the cycle are performed under the control of a sequencing circuit (not shown) which establishes the potentials needed for each stage at the various gates of the structure.

Before describing a detailed embodiment, we shall refer to FIG. 3 which shows, firstly, a cross-section view of the structure enabling the transfer of the charge Qs from the column Cj to the intermediate storage zone beneath the gate G1 and, secondly, below this section, the potential profiles in the different semiconducting regions of the structure.

In all the following explanations, the structure shall be considered to be formed in a semiconductor substrate which is essentially of the p type, and the potentials to be applied to the gate to permit a transfer of charges beneath this gate shall be considered to be positive potentials with respect to the substrate. The type of substrate and the potentials could be reversed. Furthermore, in depictions of the potential profiles, the positive potentials increase downwards according to a convention which is now a standard one in the field of charge transfer devices.

Figure 3:
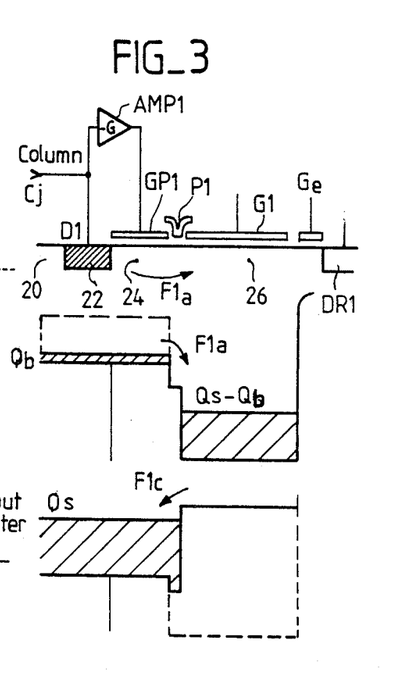
FIG. 3 shows the charges injector enabling the transfer of the charges from the column to be read to the intermediate storage gate. The corresponding potential profiles are also shown.

FIG. 3 shows the diode D1, with its cathode formed by a N type region 22 diffused in the semiconductor substrate 20. The cathode is connected to the column Cj and to the input of the negative gain −G amplifier AMP1. The output of the amplifier is connected to a passage gate Gp1 overhanging a substrate region 24 which is immediately adjacent to the cathode region 22.

In a preferred embodiment, there is provision, on the other side of the gate Gp1, for an ancillary gate P1 carried to an intermediate, fixed potential between the potentials of the passage gate Gp1 and the intermediate storage gate G1 to restrict the feedback of the gate G1 on the potential present in the region 24 beneath the gate Gp1.

On the other side of the gate P1, or else immediately next to the gate Gp1 if there is no gate P1, there is the intermediate storage gate G1 overhanging an intermediate storage gate 26 of the substrate.

Finally, adjacent to the gate G1, there is a removal gate Ge which has a normally low potential but which is carried to a potential which is much higher than that of the gate G1 at the end of each read cycle to remove the charges, stored beneath the gate G1, to the drain DR1 when they are no longer needed. The drain DR1 is a N type region diffused in the substrate and carried to a positive potential greater than that of the gate G1 at the moment of removal.

The potential graphs shown in FIG. 3 in correspondence with the various semiconductor regions show:

firstly, the transfer of the charge Qs from the diode D1 to the intermediate storage region 26 beneath the gate G1 during the stage F1a (and, of course, also during the corresponding stage, F2a, F3a etc.) of the successive steps of the read cycle);

secondly, the restitution of the charges from the intermediate storage region 26 towards the diode D1 during the stage F1c (and the stages F2c, F3c, etc. of the other stages of the cycle).

In FIG. 3, it can be seen that if the transfer from the diode D1 shows a certain degree of inefficiency or a certain degree of noise, namely if a part Qb (positive or negative) of the useful charge Qs is not transferred during the stage F1a, this part remains on the diode and enables the total reconstitution of the charge Qs on the diode when the part Qs-Qb is retransferred, at the stage F1c, to the diode D1. This reconstitution is total because the transfer from the region 26 to the diode D1 occurs with negligible noise and near 100% efficiency. It should be known, in fact, that the transfer of charges from a diode to a region under a gate is affected by a high level of noise, but the reverse transfer from a region located under a gate to a diode is practically unaffected by noise.

One of the reasons for which the invention can work efficiently therefore arises out of the observation that the transfer noise Qb varies randomly during different steps F1a, F2a, F3a etc., for there is no correlation between the noises generated during the different transfers whereas the reconstitution of the charge Qs is accurate each time.

Figure 4:
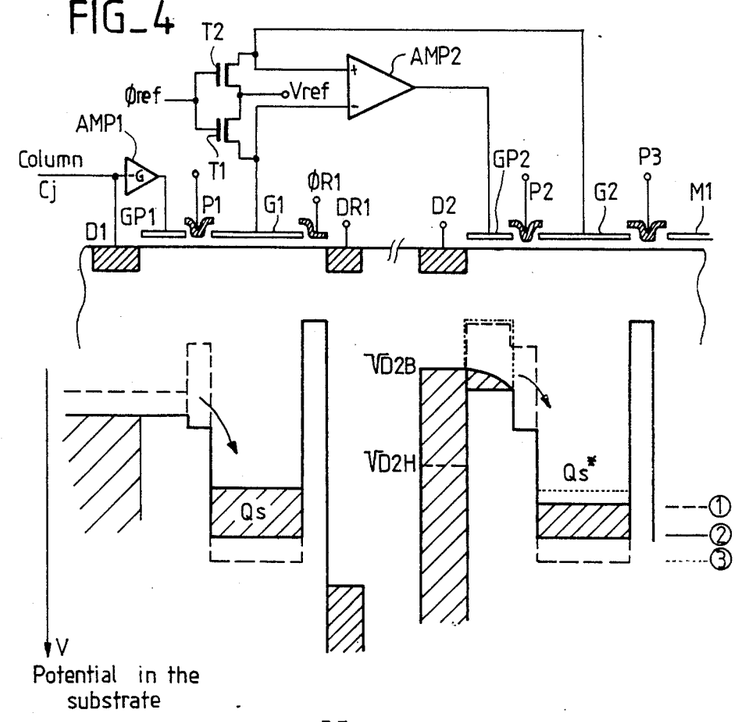
FIG. 4 shows the charge duplicator enabling the generation of the replica charge Qs*; the corresponding potential profiles are also shown.

FIG. 4 shows a sectional view of the structure used to duplicate the charge Qs stored beneath the intermediate storage gate G1 with, in correspondence with the various semiconducting regions of this structure, the successive potential profiles that exist during the duplicating operation.

The duplicator essentially has a comparator AMP2 with a first input connected to the gate G1, beneath which there is stored the charge Qs (with a transfer noise attached to it), and with a second input connected to a gate G2 beneath which the replica charge Qs* has to be generated.

The replica charge Qs* is generated by a charge injector similar to the injector connected to the column Cj.

This injector has an input diode D2 (similar to D1), a passage gate Gp2 (similar to D1).

From the viewpoint of the geometries of the structures, the thicknesses of the gate insulating material, of the semiconductor dopings, the unit D2, Gp2, P2, G2 is strictly identical to the unit D1, Gp1, P1, G1 to obtain perfect symmetry of the elements connected to the two inputs of the comparator AMP2.

It can also be envisaged that the geometries of the gates G1 and G2 will be in a given ratio to achieve a replica charge Qs* in a different, known ratio of 1 with Qs.

The inputs of the comparator are, besides, each connected to the source of a respective MOS transistor, T1 for the first input and T2 for the second input, said transistors acting as switches and having their drains connected to a reference potential Vref and their gates connected to a control terminal used to turn off the transistors for a period of time corresponding to the charge duplication stage. The transistors are made conductive before the start of this interval.

Finally, a passage gate P3, adjacent to the gate G2, enables the transfer of the replica charge Qs* from the region located beneath the gate G2 up to the region located beneath the gate M1 mentioned with reference to FIG. 1.

The charge Qs is duplicated as follows, and is illustrated by the potential level shown respectively with broken lines (at the start), unbroken lines during the transfer stage F1a or F2a etc. of the diode D1 towards the gate G1), and dotted lines (during the duplication stage proper F1b, F1c etc.).

1. Start (broken lines)

Figure 5:
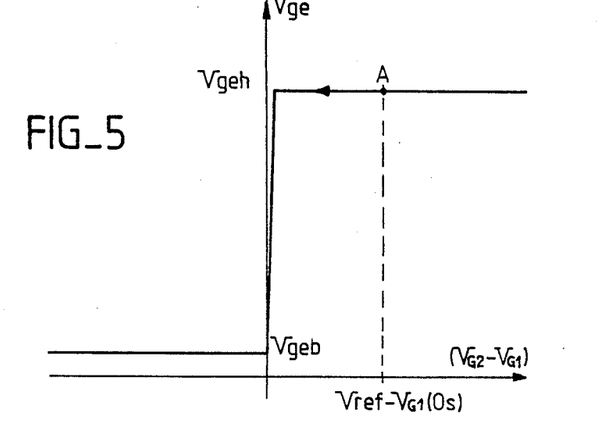
FIG. 5 shows the operating characteristic curve of the comparator of the duplicator of FIG. 4.

The gate P1 is at a low level. This keeps the charges Qs on the column. The potential Vref is applied to both inputs of the comparator. This comparator is designed to have a characteristic curve like that of FIG. 5, i.e. it has two stable states and gives a low potential Vgeb when the differential voltage is negative or null, and a high potential Vgeh when the input differential voltage is positive. The transition between these two states is as steep as possible.

At the outset, the differential voltage is null and the output level of the comparator is therefore Vgeb. Besides, the cathode of the diode D2 is carried to a high level Vd2h. There is therefore no injection of charges beneath the gate G2

2. Transfer of Qs (unbroken lines)

The transistors P1 and P2 are off and the gates G1 and G2 become floating. At the same time, the gate P1 is carried to a high level, thus enabling the transfer Qs beneath the gate G1. By symmetry, an identical potential is preferably applied at the same time to the homologous gate P2. The potential of the gate G1 diminishes as and when charges collect beneath this gate. Very quickly, the comparator flips and its output goes to the high level.

3. Generation of Qs* (dotted lines)

The potential of the diode D2 is then carried to a low potential Vs2b, thus enabling the injection of charges beneath the gate G2. As and when this injection occurs, the potential of the gate G2 falls; when the potential of G2 reaches that of G1, the comparator flips over again and shuts off (through the gate Gp2) any additional injection of charges from the diode D2 to the gate G2.

The charge Qs*, which is then present beneath the gate G2, is the same as the charge Qs beneath the gate G1 for the above-mentioned reasons of symmetry.

Figure 6:
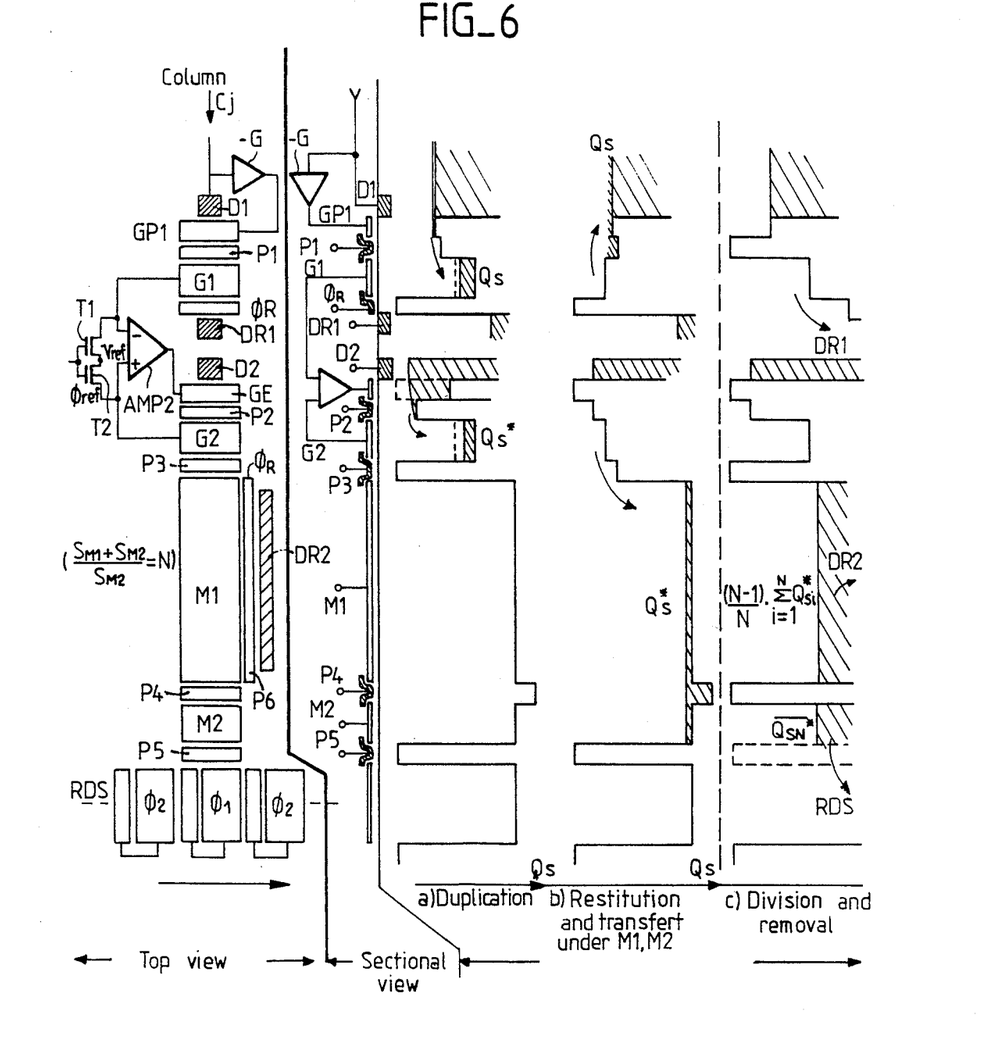
FIG. 6 shows a general view, a top view, and a sectional view of a preferred embodiment of the invention; the corresponding potential profiles are also shown.

FIG. 6 shows the entire structure enabling the implementation of the invention, in a top view and a cross-sectional view, and also with the potential profiles in the various semiconductor regions during the main stages of operation.

The elements already described shall not be described again. These are the charge injector at the output of the column Cj and the charge duplicator. The same references are repeated for these elements as in the above figures.

On one side of the gate P3, there is the gate G2. On the other side, there is a gate M1 which may be called an accumulation gate, for it is beneath this gate M1 that it is sought to collect the replica charges Qs* generated beneath the gate G2 during the successive duplication stages F1b, F2b, etc.

On the other side of the gate M1, there is a blocking gate P4 and, on the other side of this gate P4, there is a gate M2 which is permanently carried to the same potential as the gate M1. The gate M2 plays a role in the accumulation of the charges so long as the blocking gate P4 is at a higher potential than that of the metallizations M1 and M2, and the charges transferred from the gate G2 to the gate M1 are in fact distributed between the gates M1 and M2 in proportion to their respective areas. On the contrary, when the accumulation of charges is completed at the end of Nth step, the blocking gate P4 is carried to a low potential (immediately before the start of the stage Fnd of FIG. 1) and the charges stored beneath the gate M2 are then isolated from the charges stored beneath the gate M1. A fraction of the accumulated charges remains beneath the gate M2, and the rest remains beneath the gate M1. It is this fraction stored beneath the gate M2, for example N times smaller than the totality of the charges that have collected beneath the two gates M1 and M2, which can be transferred to the output shaft register RDS through a passage gate P5 open during the phase Fnd.

Finally, the structure includes, close to the metallization M1 and separated from it by a passage gate P6, the drain DR2 already mentioned with reference to FIG. 2. This passage gate is opened during a final stage Fne to discharge the charges remaining beneath the gate M1 at the end of the read cycle.

In the foregoing description, no mention has been made of the possibility of transferring to the output, with the charge Qs, a so-called "driving charge" with the function of ensuring that a minimum quantity of charges is physically transmitted even when the useful charge Qs is very small.

This facilitates the reading of the weak charges, providing that the driving charge is really constant from one measurement to another.

A reading method with driving charges is described in the U.S. Pat. No. 4,611,234.

If a driving charge is used, then this charge is duplicated at the same time as the useful charge Qs. It is found multiplied by N in the sum of charges that have collected beneath the gates M1 and M2, and it is found yet again in the mean transferred from the gate M2 to the output of the circuit.

Since the output register RDS is no longer in a direct link with the gate G1 and the column, it is no longer possible to provide for the rise, in the upstream direction, of the driving charge from this register to the column. The consequence of this is that it is no longer possible to introduce the driving charge from the output register.

In the present invention, it is proposed to introduce the driving charge from an ancillary register located not on the same side as the output register but on the other side of the photosensitive matrix itself (i.e. at the other end of the columns of this matrix).

Figure 7:
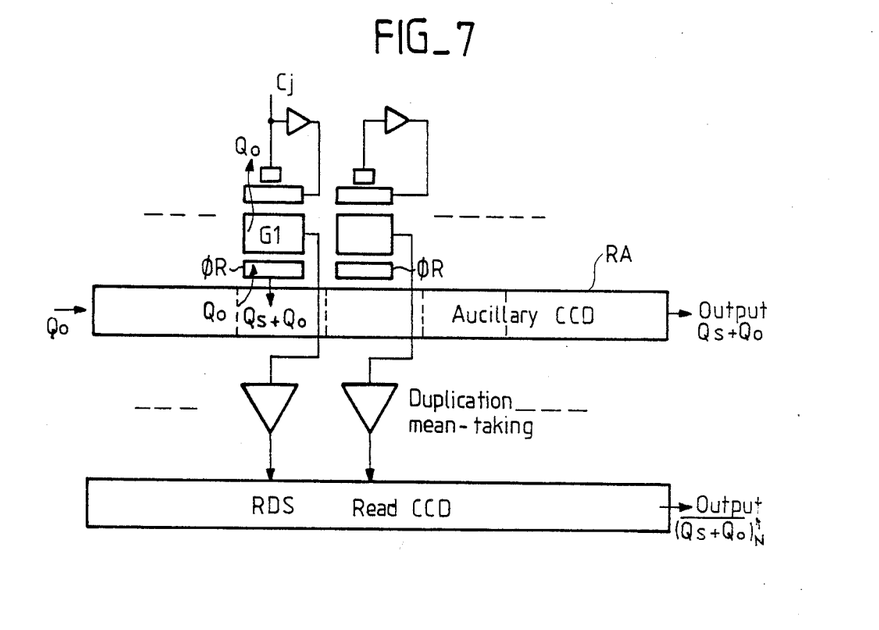
FIG. 7 shows an improvement used to add a driving charge to the charge to be read when it is desired to clearly read even the weak charges.

In another embodiment, shown schematically in FIG. 7, the discharge drain DR1, adjacent to the gate G1 (FIG. 1), is replaced by a compartment of an ancillary charge transfer register RA, separated from the gate G1 by a transfer gate in the same way as the drain DR1 was separated from the gate G1. This gate permanently conveys a charge, equal to the desired driving charge, from one end to the other. This charge Q0 is injected into one end of the register. The charge Q0 is injected from the register to beneath the gate G1 and from the gate G1 to the column Cj at each restitution stage F1c, F2c, etc.

Should the capacity of the column be very high, the amplitude of the driving charge becomes excessive; it must be reduced by successive inputs, with amplitude reduction in intermediate transfer sites, until its amplitude becomes acceptable. A method to do this is described in the French patent No. 86 17571. It is only after this that the duplication and mean-taking operations are carried out.

In conclusion, it must be noted that it is particularly advantageous for the charge transfers to be effected in volume and not in area, as described in the French patent No. 83 14543, namely that the doping of the semiconductor substrate should be such that the conduction bands inside the substrate have a minimum inside the volume (near the surface), but not on the surface itself.

What is claimed is:

1. A method for the reading of electrical charges collected at an input conductor, comprising an operation for the transfer of charges from the input conductor to an intermediate storage zone, this operation being repeated N times with N as a whole number greater than or equal to two, and an operation for a transfer, from the intermediate zone towards an output, of a quantity of charges proportionate to the sum of charges transferred during the N preceding transfer operations, and wherein each operation for the transfer of a quantity of charges Qs from the input conductor to the intermediate storage zone is followed by an operation for the duplication of charges by which there is formed a charge Qs* which is a replica of the charge Qs, the replica charge being in a pre-determined ratio with the initial charge, and then an operation for the restitution of the charge Qs to the input conductor.

2. A reading method according to claim 1, wherein each duplication operation is followed by an accumulation operation by which the replica charges formed during successive duplication operations are accumulated.

3. A charge reading circuit connected to an input conductor conveying a quantity of charges Qs to be read, said circuit comprising:
- a means to transfer a quantity of charges to be read, from the input conductor to an intermediate storage zone;
- a means to generate a quantity of charges which is the replica of the charge transferred into the intermediate storage zone;
- a means to retransfer the charge stored in the intermediate zone to the input conductor;
- a means to repeat the operations for the transfer from the input conductor to the intermediate storage zone and for the generation of a quantity of charges which is a replica of the transferred charge;
- a means to store a charge which is the sum of the replica charges;
- and a means to transfer a charge, proportionate to the sum of the replica charge, towards an output.

4. A read circuit according to claim 3, wherein the means to transfer the charges from the input conductor to the intermediate storage zone is a charge injector comprising the diode connected to the input conductor, a passage gate between the diode and the intermediate storage zone, an intermediate storage gate above the intermediate storage zone, and a negative gain amplifier having an input connected to the input conductor and an output connected to the passage gate.

5. A read circuit according to claim 4, wherein the means to generate the quantity of replica charges comprises, firstly, a second injector similar to the first one, comprising a diode, a passage gate, an ancillary storage gate on top of an ancillary storage zone, secondly, a comparator having a first input connected to the intermediate storage gate, a second input connected to the ancillary storage gate and an output connected to the passage gate of the second injector and, finally, a means to temporarily apply a reference voltage to the two inputs of the comparator.

6. A read circuit according to claim 3, wherein the means to store the sum of the replica charges comprises two storage gates, carried to the same potential, separated from each another by a passage gate carried to a potential greater than the potential of the two gates.

7. A read circuit according to claim 6, wherein the means to transfer, towards the output, a charge proportionate to the sum of the replica charges, comprises a means for the control of the passage gate located between the two storage gates of the means for the storage of the sum of the replica charges, to greatly reduce the potential of this passage gate, and a means to then reduce the potential of one of the two gates which surround it.

8. A read circuit according to claim 3, wherein its input is connected to a column conductor of a photosensitive matrix.

9. A read circuit for a line transfer photosensitive matrix, comprising several circuits according to claim 3, each connected to a respective column of the matrix.

* * * * *